United States Patent [19]
Von Kienlin

[11] Patent Number: 5,506,504
[45] Date of Patent: Apr. 9, 1996

[54] METHOD AND APPARATUS FOR CONDUCTING A SPATIALLY RESOLVING MAGNETIC RESONANCE EXAMINATION OF A TEST SUBJECT

[75] Inventor: Markus Von Kienlin, Semmelstr. 47, 97070 Wuerzburg, Germany

[73] Assignee: Markus Von Kienlin, Wuerzburg, Germany

[21] Appl. No.: 217,457

[22] Filed: Mar. 24, 1994

[30] Foreign Application Priority Data

Mar. 26, 1993 [DE] Germany ............................ 43 09 958.0

[51] Int. Cl.⁶ .................................................. G01V 3/14
[52] U.S. Cl. ........................................ 324/309; 324/307
[58] Field of Search .................................. 324/306, 307, 324/308, 309, 314

[56] References Cited

U.S. PATENT DOCUMENTS

| | | |
|---|---|---|
| 4,644,277 | 2/1987 | Kunz . |
| 4,651,098 | 3/1987 | Yamada et al. . |
| 4,766,380 | 8/1988 | Den Boef et al. . |
| 5,122,748 | 6/1992 | Oh et al. . |

FOREIGN PATENT DOCUMENTS 0156442  6/1989  European Pat. Off. .

OTHER PUBLICATIONS

"Superresolution Limit for Signal Recovery," Kosarev, Maximum Entropy and Bayesian Methods, Skilling (ed), 1989, pp. 475–480.
"Maximum Entropy and Bayesian Approach in Tomographic Image Reconstruction and Restoration," Mohammad–Djafari et al., Maximum Entropy and Bayesian Methods, Skilling (ed), 1989, pp. 195–201.
"The Ancient and Honourable Art of Shimming," Chmurny, et al., Concepts in Magnetic Resonance, 1990, (May) vol. 2, pp. 131–149.
"Spectral Localization with Optimal Pointispread Function," von Kienlin, et al., J. of Mag. Res., vol. 94 (1991), pp. 268–287 (Oct.).
"SLIM: Spectral Localization by Imaging," Hu, et al., Magnetic Resonance in Medicine, vol. 8 (1988), pp. 314–322, Jan.
"A Target Field Approach to Optimal Coil Design," Turner, J. Phys. D. Appl. Phys., vol. 19 (1986), May pp. L147–L151.
"A Generalized Series Approach to MR Spectroscopic Imaging," Liang, et al., IEEE Trans. on Med. Imaging, vol. 2 (Jun. 1991), pp. 132–137.
"The Signal–to–Noise Ratio of the Nuclear Magnetic Resonance Experiment," Hoult, et al., J. of Mag. Res., vol. 24 (1976), pp. 71–85 Mar.
"Selection of Optimum Parameters for Pulse Fourier Transform Nuclear Magnetic Resonance," Becker, et al., Analytical Chemistry, vol. 51, No. 9 (Aug. 1979), pp. 1413–1420.
"Localized Spectroscopy Using Static Magnetic Field Gradients: Comparison of Techniques," Decorps, et al. NMR Basic Principles and Progress, vol. 27, pp. 119–147 (1992).

*Primary Examiner*—Sandra L. O'Shea
*Assistant Examiner*—Mack Haynes
*Attorney, Agent, or Firm*—Hill, Steadman & Simpson

[57] ABSTRACT

For achieving a higher topical resolution and a better signal-to-noise ratio, a method for spatial resolution in a magnetic resonance examination implements the phase-encoding with non-linearly location-dependent magnetic fields. An apparatus for the implementation of the method is also disclosed.

10 Claims, 4 Drawing Sheets

METHOD AND APPARATUS FOR CONDUCTING A SPATIALLY RESOLVING MAGNETIC RESONANCE EXAMINATION OF A TEST SUBJECT

BACKGROUND OF THE INVENTION

1. Field of the Invention

The present invention is directed to a method and apparatus for conducting a spatially resolving magnetic resonance examination of a test subject divided into a plurality of arbitrarily prescribed regions.

2. Description of the Prior Art

It is known to undertake a plurality of phase-encoded discrete measurements at least corresponding in number to the number of regions of a test subject, employing magnetic fields for the purpose of phase-encoding. The phase dispersions corresponding to each phase-encoded discrete measurement are calculated for each region, and the signal part arising from each region is calculated from the calculated phase dispersions and from the aggregate signals obtained in all discrete measurements.

Such procedures make it possible to select and to determine the spatial origin of magnetic resonance (MR) signals within a larger test subject. Such methods can be applied both in nuclear magnetic resonance (NMR) as well as in electron spin resonance (ESR).

In a known method of the type initially described (Hu et al. Magnetic Resonance in Medicine, Vol. 8, pp. 314–322 (1988)), gradient fields that have a linear locationdependency are employed for phase-encoding. The spatial resolution thereby achieved and the signal-to-noise ratio that can thereby be achieved, however, do not always prove satisfactory.

SUMMARY OF THE INVENTION

It is an object of the present invention to improve a method of the type initially described to achieve a better spatial resolution and a higher signal-to-noise ratio, and to specify an apparatus for the implementation of the method.

This object is achieved in a method in accordance with the invention wherein at least one of the magnetic fields serving for phase-encoding exhibits a non-linear locationdependency in at least one of the discrete measurements.

Whereas the magnetic fields serving for phase-encoding in the known methods exhibit only constant gradients (whose component that is aligned with the static, main magnetic field, usually referred to as z-component is thus directly proportional to one direction of the space), at least one non-linear, location-dependent magnetic field is employed in the method of the invention. Such magnetic fields shall be referred to below as "magnetic fields of a higher order", since the mathematical dependency of their local field strengths on the location in a Cartesian coordinate system usually contains higher powers of the spatial coordinates x, y and z. The method of the invention, however, is not limited to location-dependencies of this type. Instead, all "magnetic fields of a higher order" whose local field strength is neither spatially constant nor directly proportional to the spatial directions are suitable for the implementation of the method of the invention.

The phase dispersion within the individual regions can be reduced by the inventive selection of the magnetic fields serving for the phase-encoding, as a result whereof a better topical resolution and a higher signal-to-noise ratio are achieved. In addition to an enhanced precision, the overall duration of the measurement can be shortened, permitting to an increased specimen throughput and lower costs. Quantitative measurements can also be made with the method of the invention. The method can be employed both in MR-imaging with a single resonant frequency, whereby the spatial distribution of a single type of spin source is sought, and in localized MR-spectroscopy, wherein MR-spectra are to be measured with a plurality of resonant frequencies.

In an embodiment of the method of the invention the magnetic fields serving for phase-encoding are formed by superimposition of the components of a spherical base. As is known, a magnetic field can be developed according to spherical harmonics, these spherical harmonics thus forming components of a spherical base for any arbitrary magnetic field. Practically any desired local course of the magnetic field strength can thus be presented by the superimposition of the components of this spherical base. The shim coil system provided in conventional magnetic resonance systems is usually also designed such that its individual coils each generate spherical field components. The method of the invention can thus be implemented in a conventional magnetic resonance apparatus insofar as its shim coil system is suitably driven.

In a further embodiment the field dependency along at least one spatial axis approximately corresponds to a step function. As a result, a raster corresponding to the step function is produced along the one spatial axis, this raster having high spatial resolution along this spatial axis. If the step function dependency is implemented along all three orthogonal coordinate directions that define the space, the regions of the test subject thereby defined form spatial raster cells, within each of which the phase is constant and, consequently, a high spatial resolution is obtained.

An apparatus suitable for the implementation of the method of the invention has means for generating a main magnetic field, means for generating the magnetic fields serving for phase-encoding, and means for calculating the signal part arising from each sub-region, with the means for generating the magnetic fields serving for phase-encoding comprising means for offering currents that serve the purpose of generating the nonlinearly location-dependent magnetic fields.

In the apparatus of the invention, the shim coil arrangement required for homogenization of the main magnetic field is advantageously simultaneously used for generating the magnetic fields with non-linear location-dependency that serve for phase-encoding. To this end, suitable currents which produce the desired magnetic fields for the phase-encoding are supplied to the shim coils in addition to the currents that serve the purpose of homogenization. The apparatus of the invention thus has a simple structure and enables practically any desired shape of the magnetic fields serving for phase-encoding to be generated.

DESCRIPTION OF THE PREFERRED EMBODIMENTS

Phase-encoding ensues in a well-known manner in the prior art on the basis of magnetic fields superimposed on the static, main magnetic field in the time span between the first radio-frequency pulse serving the purpose of spin excitation and the end of the signal pick-up of every discrete measurement. In a known way, these magnetic fields lead to a controlled influencing of the phase of the measured MR signals. As a result, the spatial origin of the measured MR signals can be controlled in one, two, or in all three dimensions of the space. Primarily the case of a single spatial dimension is described in the following description; the extension thereof onto two or onto all three spatial dimensions can be seen therefrom without further difficulty.

Figure 1A:
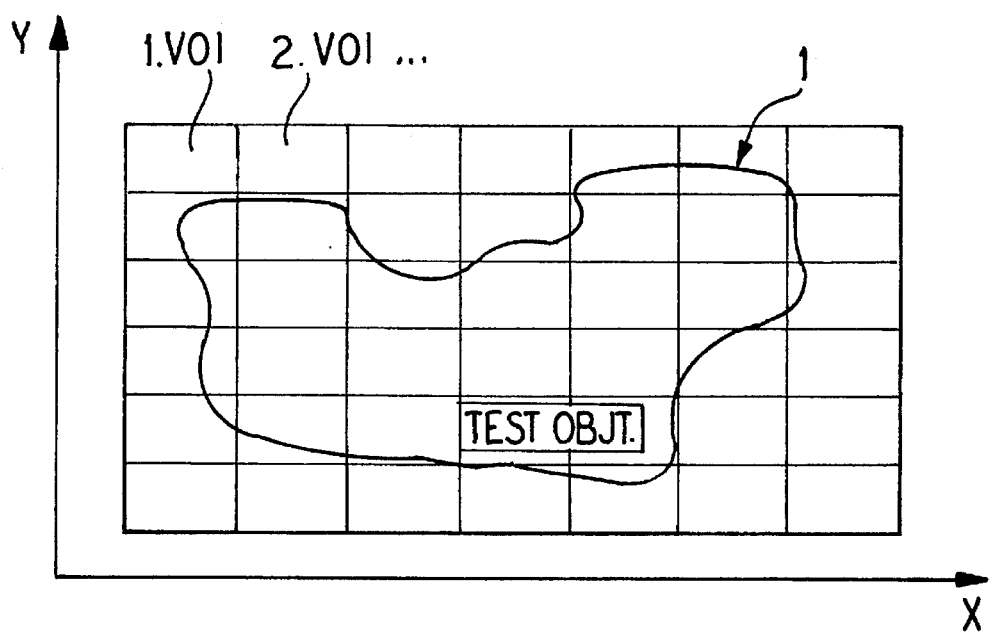
FIGS. 1A and 1B respectively illustrate a test subject divided into a regular grid of regions and into arbitrarily selected regions in two spatial dimensions.
Figure 1B:
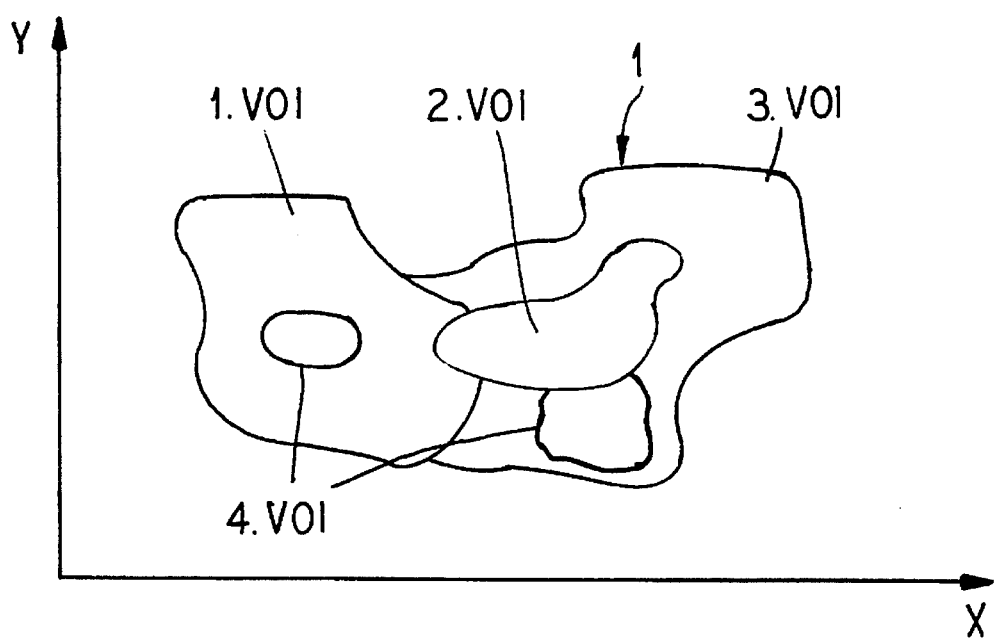

As proceeds by example from FIGS. 1A and 1B, a test subject 1 is divided into a plurality of regions at the beginning of the MR examination, these being referred to as "VOl" (volume of interest) based on tile usage of localized nuclear magnetic resonance spectroscopy. Dependent on whether one, two or three directions of the space are to be resolved in the MR examination, the VOl is thus a distance, an area or a spatial volume. The plurality, size and shape of the desired VOIs is dependent on the goal of the MR examination and, if available, on previously existing knowledge about the internal structure of the test subject 1.

Insofar as no information about the test subject 1 is initially available, a regular grid can be placed over the test subject 1 according to FIG. 1 A, for example as is standard procedure for MR imaging, whereby each grid element represents a specific VOl. Insofar as knowledge about the test subject 1 already exists, for example from a preceding, imaging MR examination, this information can be used according to FIG. 1B to define VOIs having a prescribed shape, size and connectivity. As proceeds from FIG. 1B, the VOIs can comprise arbitrary concave or convex shapes. Further, specific VOIs can be formed of two non-contiguous regions of the test subject 1, as shown for the fourth VOl in FIG. 1B.

The MR signals from such spatially defined VOIs are to be measured with the greatest possible precision and with the best possible sensitivity. To this end, experimental parameters are suitably selected for the MR examination.

Particularly important in this context is the selection of the magnetic fields utilized for phase-encoding; these do not exclusively comprise constant gradients whose components aligned with the static, main magnetic field, which is usually referred to as the z-component, is directly proportional to one coordinate of the space. On the contrary, at least one magnetic field is utilized in the inventive method whose z-component exhibits a field strength having a non-linear location-dependency. Such a magnetic field referred to below as "magnetic field of a higher order", for example, comprises higher powers of at least one of the spatial coordinates x, y, or z in a Cartesian coordinate system. In general, such magnetic fields of a higher order are magnetic fields whose field strength is neither constant in the space nor directly proportional to one spatial direction.

For a better understanding of the results achieved by a phase-encoding magnetic field of a higher order, a MR examination with locally constant magnetic field gradients corresponding to the current state of the art shall first be set forth. According to FIG. 2A, a VOl whose length corresponds to one-fourth of the total length of the test subject 1 is selected in a one-dimensional test subject 1. According to FIG. 2B, four phaseencoded, discrete measurements are implemented with location-constant magnetic field gradients that are of respectively different strengths, and the location-dependencies of the phase of the measured MR signals shown in FIG. 2B are obtained. The signal part allocated to the VOl is then reconstructed on the basis of a Fourier transformation of the measured, aggregate signals.

The quality of such a measurement is determined, first, by the spatial resolution, i.e. the quality of the localization of the signal part arising from the particular region, and second, by the sensitivity that is achieved, i.e. the quality of the utilization of the existing magnetization level. An analysis of the quality of the MR examination can ensue on the basis of the definition of the spatial reply function of each and every sub-region or VOl. The spatial reply function of a VOl indicates the weighting for the spins at every location of the subject 1 with which these spins contribute to the reconstructed signal of this VOl. The calculation of the spatial reply function is set forth in greater detail below.

Figure 2A:
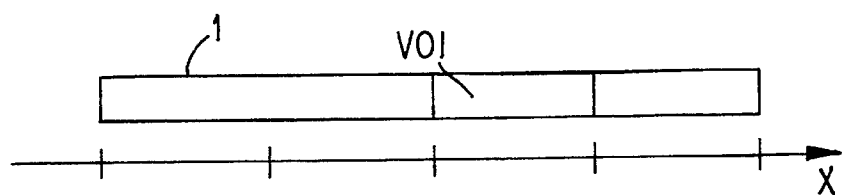
FIGS. 2A, 2B, and 2C respectively show an example of a one-dimensional test subject, and examples of the phase curve dependent on the locus coordinate and on the spatial reply function for a selected region for explaining the prior art employing constant magnetic field gradients for phase-encoding.
Figure 2B:
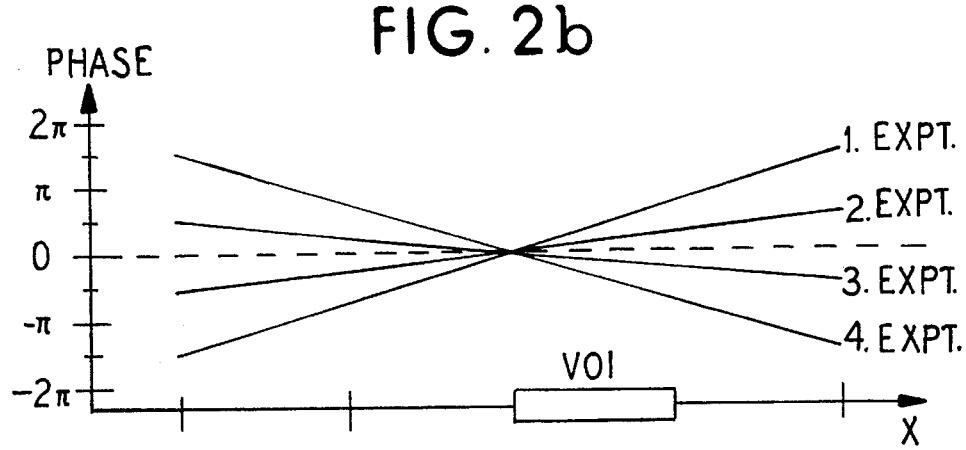
Figure 2C:
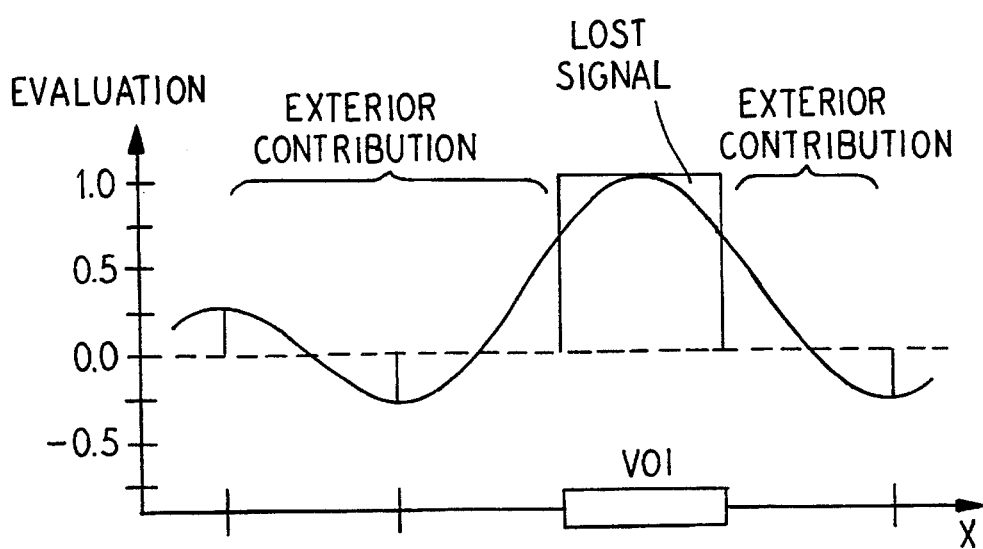

The spatial reply function for the example illustrated in FIG. 2A is set forth in FIG. 2C. Undesired contributions from regions outside the selected VOl as well as a signal loss in the inside of the VOl can be clearly seen therein. The quality of the localization and of the signal yield is thus imperfect. The reason for this is that only linear phase curves can be generated by the locally constant magnetic field gradients. A therefore, phase dispersion which leads to signal losses, and does not allow a perfectly complete matching of the spatial reply function to the shape of the VOl, thus necessarily exists in the interior of the selected VOl.

As a result of the phase-encoding with magnetic fields of a higher order provided in the inventive method, these conditions can be decisively improved. In an idealized example shown in FIG. 3A, two discrete measurements are carried out. In the first, the phase of the registered aggregate MR signal is kept constant over the entire volume of the test subject. In a second discrete measurement, the phase within the selected VOl is shifted by $\pi$ compared to the outside space on the basis of suitably selected magnetic fields of a higher order. The manner by which such a phase curve can be approximately achieved shall be set forth in greater detail below.

Figure 3A:
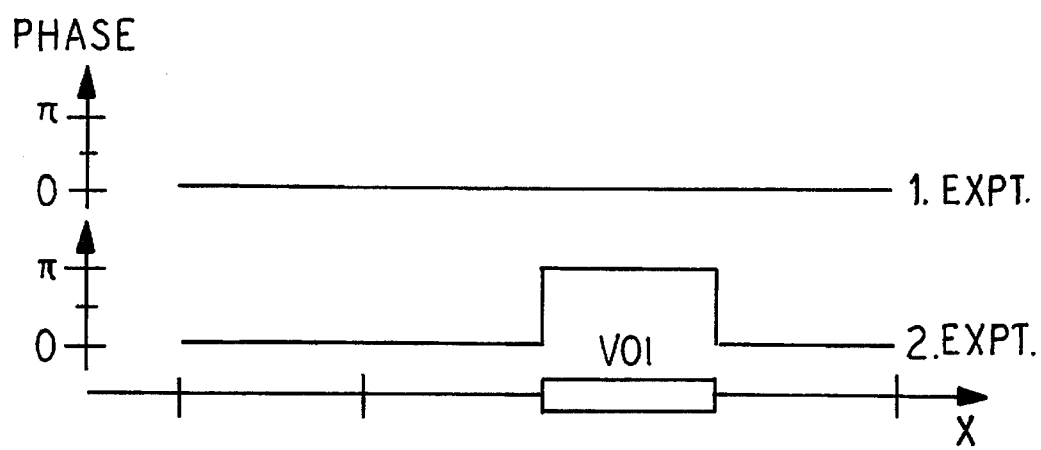
FIG. 3A and 3B respectively illustrate the dependency of the phase on the location coordinate given phase-encoding with non-linearly location-dependent magnetic fields in accordance with the principles of the present invention, and the spatial reply function thereby obtained.
Figure 3B:
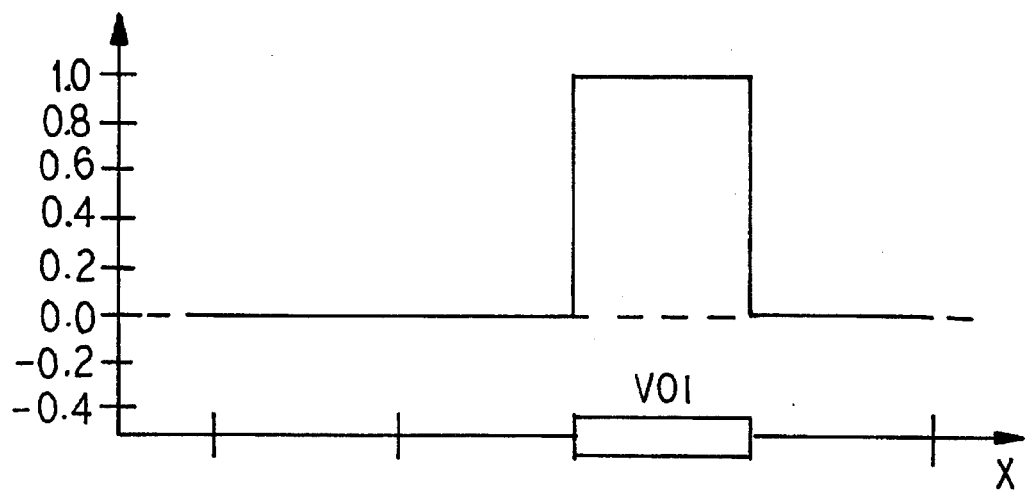

The phase shift by $\pi$ is equivalent to an inversion of the signal level within the VOl. The signal part of the associated VOl can therefore be obtained by simple subtraction of the aggregate signals obtained in the two discrete measurements. According to FIG. 3B, the spatial reply function corresponding to the example of FIG. 3A is free of signal losses and is free of contributions deriving from outside the VOl. In the illustrated, ideal case, thus, a reply function free of all deficiencies is obtained.

In practice, only an approximation to the ideal phase-encoding set forth with reference to the above example can be achieved for various reasons. The spatial resolution and the signal yield achieved can be utilized for evaluating the extent of the approximation to the ideal case. A possible sensitivity criterion and a possible criterion for evaluating the localization are presented below. Dependent on the desired application, these criteria can be adapted or further criteria, such as the overall duration of the experiment, can also be introduced.

The optimization of the selected quality criteria can occur either on the basis of an analysis of the spatial structure of the VOl or on the basis of a numerical optimization. In the latter instance, the phase-encodings are varied in a numerical simulation of the measurement and the quality criterion following therefrom is calculated every time until a suitable set of phase-encodings is found.

In addition to the phase-encoding, further experimental parameters can be suitably determined. Included among these parameters, for example, are the rotational angle of the exciting radio-frequency pulses and the delay between consecutive radio-frequency pulses which must be selected according to the relaxation times of the observed spin type. For example, the number of signal accumulations per discrete measurement may also be included among these parameters.

It is not necessary that the definition of the VOIs and the identification of the experimental parameters ensue anew for each measurement. In many applications, it will be possible to have recourse to the parameters of standard measurements prepared earlier and to begin directly with the implementation of the current measurement.

As presented above, it can be desirable for an optimum signal yield to take the phase dispersion within the VOl as slight as possible and to generate pronounced phase modifications at the edges. Such phase-encodings can be achieved with one or more dedicated coils that generate suitable magnetic fields. Such coils, for example, can be calculated with the so-called "target field approach" (see Turner, "A Target Field Approach To Optimal Coil Design", J. Phys. D: Appl. Phys., 19, L147-L151, (1986)).

Figure 4:
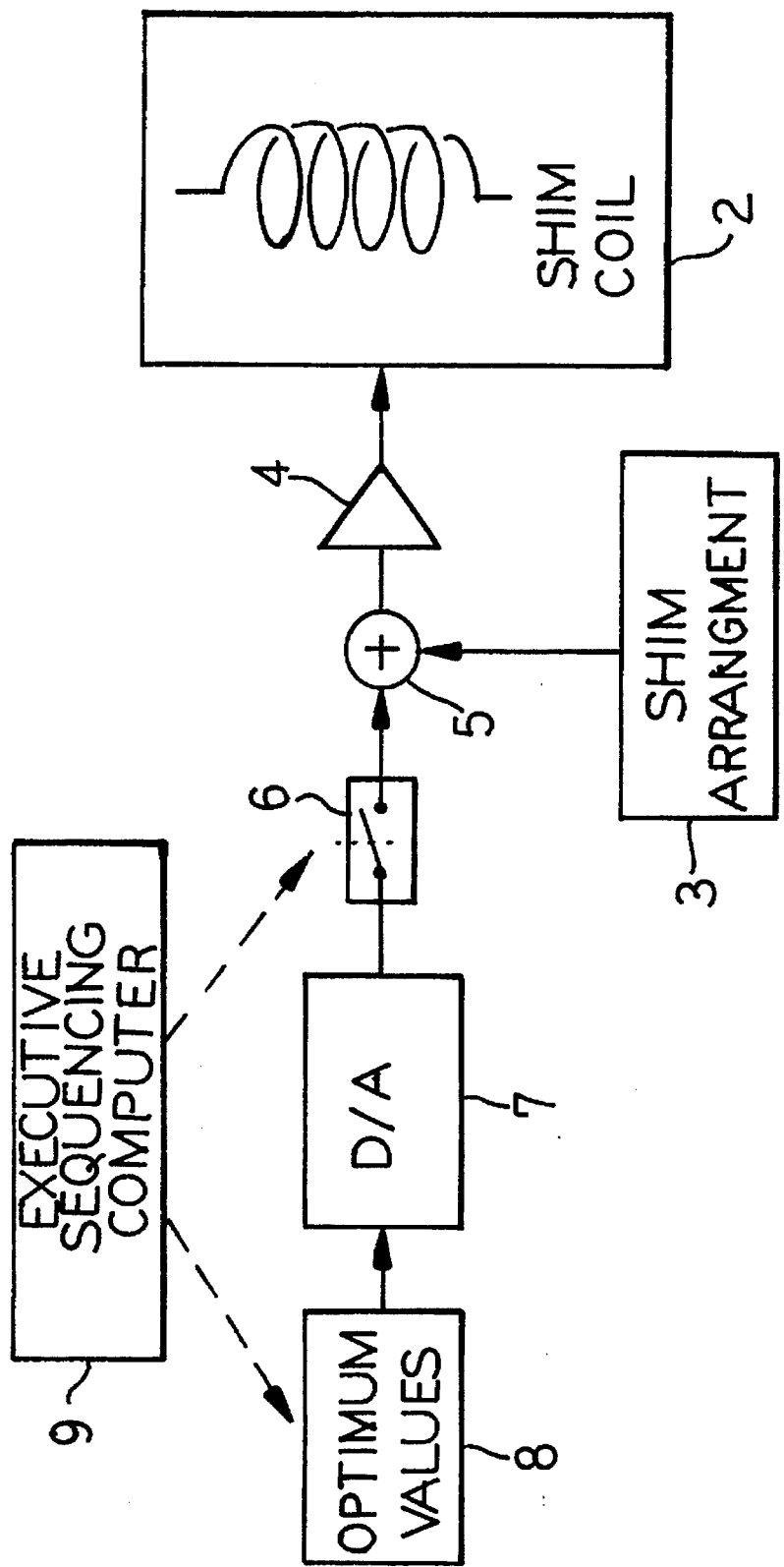
FIG. 4 is a block diagram of an apparatus for magnetic resonance examination with phase-encoding on the basis of non-linearly location-dependent magnetic fields constructed and operating in accordance with the principles of the present invention.

An apparatus for the implementation of the method shown in FIG. 4 enables a more flexible utilization. In a known way, this apparatus includes a shim coil arrangement (see Chmurny et al. "The Ancient and Honorable Art of Shimming", Concepts in Magnetic Resonance, 2, 131–149 (1990)) whose coil set makes it possible to approximate practically any desired distribution of the field intensities in space. This set of shim coils, one thereof being referenced 2 in FIG. 4, conventionally serves the purpose of homogenizing the main magnetic field employed for the magnetic resonance examination. To this end, the shim coil arrangement comprises a shim unit 3 which supplies pre-set values with which an amplifier 4 is controlled such that the shim coil 2 connected thereto is supplied with the current required for the homogenization of the static, main magnetic field. It should be noted that one channel of the type illustrated in FIG. 4 is provided for each shim coil of the shim coil arrangement.

In order to also be able to simultaneously generate the magnetic fields serving for phase-encoding using the shim coil arrangement, a summing unit 5 preceding the amplifier 4 is provided having an one input is connected to the shim unit 3. Values from a cable 8 that correspond to optimum values current for generating the phase-encoding magnetic fields, are supplied to the other input of the summing 5 by a switch 6 and via a digital-to-analog converter 7. The switch 6 is closed by an executive sequencing computer 9 at a point in time suitable for the implementation of the phase-encoding, and the current required for generating the magnetic field is thereby supplied to the respective shim coil 2 via the summing unit 5 and via the amplifier 4. In the schematic structure shown in FIG. 4, the offering of the currents serving the purpose of phase-encoding ensues in the form of square-wave pulses. Other pulse curves such as trapezoidal, triangular, half-sine or the like, can also be generated on the basis of a suitable fashioning of the circuit structure; this can be more favorable in view of the inductance for the switching behavior of the shim coil 2 that generates the magnetic field, and in view of eddy currents induced in conductive parts of the apparatus during the transients of the generated magnetic field.

Conventionally, the shim coils 2 are of such a nature that their magnetic field respectively corresponds to one component of the resolution of the space into spherical harmonics. Other coil sets are also conceivable, however, that realize the solutions with respect to other base systems of the space. Field distributions that are likewise arbitrary can be generated up to a certain approximation by supplying suitable currents through such coil sets. The precision that can be achieved generally increases with the plurality of coils employed.

For a spatially resolving magnetic resonance examination, it is necessary to supply currents corresponding to the optimally identified parameters through the coil set at exactly defined points in time during the execution of the measurement in order to generate the magnetic fields of a higher order that serve the purpose of phase-encoding. The phase-encoding can thereby ensue before or during the actual signal pick-up. An instrumentation similar to that standard in nuclear magnetic resonance tomography systems for switching the imaging gradients can be employed for switching the current in conventional instruments, only three such switching means are present for switching a locally constant magnetic field gradient in each of the three spatial directions, however, substantially more channels may be required for the inventive method for phase-encoding with magnetic fields of a higher order in order to be able to drive all coils 2 of the coil set.

The reconstruction of the signal parts arising from the individual VOIs from the aggregate signals obtained in all discrete measurements can be implemented by modifying a method known, for example, from the aforementioned Hu et al. article. This is based on the calculation of a simulated model of the experiment. On the basis of a numerical matching routine, those reconstruction coefficients that supply the signal parts of the VOIs with the smallest possible error can then be calculated.

In detail, this reconstruction method presumes that the spatial coordinates of N VOIs have been defined whose MR signals are to be identified, and that M phaseencoded, discrete measurements, also referred to as sub-experiments, have been implemented for this purpose ($M \geq N$). Only those components of the magnetic fields relevant for the MR experiment that are aligned with the static, main magnetic field are fundamentally taken into consideration.

The aggregate MR signal that is registered from the entire test subject in a phaseencoded experiment can be expressed as the sum of the signals of all VOIs:

$$p_m = \sum_{n=1}^{N} g_{mn} \cdot c_n, m = 1, \ldots, M \tag{1}$$

wherein $P_m$ thereby stands for the mth phase-encoded signal and $c_n$ is the signal part per volume unit of the $n^{th}$ VOl without phase-encoding. Usually, the signals $P_m$ and $c_n$ are recited as functions of time, however, they can be recited just as well as functions of the frequency or in other presentations. The term $g_{mn}$ describes the phase dispersion over the $n^{th}$ VOl for the $m^{th}$ phase-encoding step and can be calculated in conformity with the following considerations.

All of the magnetic fields of the coil system utilized for phase-encoding linearly superimpose in the space without mutually influencing one another. The field $B_m$ at a point having the coordinates of (x, y, z) at a point in t during the $m^{th}$ phase-encoding can therefore be calculated as the sum of the fields of all coils S.

$$B_m(t, x, y, z) = \sum_S I_{ms}(t) \cdot B_S(x, y, z) \quad (2)$$

wherein $I_{ms}(t)$ stands for the current through the $S^{th}$ coil for the mth phase-encoding at point in time t, and $B_s$ indicates the magnetic field for every point in the space that is generated thereat per unit of current through the coils. Except for a proportionality constant, the functions $B_s(x,y,z)$ can be derived for a conventional shim coil system from table 3 in the aforementioned Chmurny et al. article. In practice, one must review to see whether the real shim coil system coincides with these theoretical values. Excerpted functions for some shim coils are recited in the following table:

| Standard designation | Function |
|---|---|
| x | x |
| y | y |
| z | z |
| $z^2$ | $2x^2 - (x^2 + y^2)$ |
| $z^3$ | $z[2x^2 - 3(x^2 + y^2)]$ |
| zx | zx |
| $z^2x$ | $x[4x^2 - (x^2 + y^2)]$ |
| . | . |
| . | . |
| . | . |

Let the duration during which the fields for phase-encoding are adjacent be $\tau$, beginning at point in time $t_o$. The phase shift $\phi$ (x,y,z) that the MR signal experiences at the coordinates (x, y, z) during the phase-encoding is then obtained from:

$$\phi_m(x, y, z) = \gamma \cdot \int_{t_0}^{t_0 + \tau} B_m(t', x, y, z) dt' \quad (4)$$

The gyromagnetic ratio is referenced $\gamma$; the terms can be $g_{mn}$ ultimately calculated as:

$$g_{mn} = \int_{VOI_n} e^{-i\phi_m(x,y,z)} dx dy dz \quad (5)$$

wherein $i = \sqrt{-1}$.

Consequently, the terms $g_{mn}$ describe the phase dispersion of the MR signals caused by the mth phase-encoding step, integrated over the $n^{th}$ volume.

Equation [1] can be written in matrix form:

$$P_M = G C_N \quad (6)$$

whereby $P_M$ stands for the vector of M measured, phase-encoded signals, $C_N$ stands for the vector of the N signals of all VOIs without phase-encoding; G is a complex M×N matrix having the elements $g_{mn}$. One possibility of solving equation [6] for the sought $C_N$ is to factor the matrix G with a singular value decomposition:

$$G = U \begin{pmatrix} \sigma_1 & \ldots & 0 \\ . & & . \\ . & & . \\ . & & . \\ 0 & \ldots & \sigma_N \\ 0 & \ldots & 0 \\ . & & . \\ . & & . \\ . & & . \\ 0 & \ldots & 0 \end{pmatrix} V^* \quad (7)$$

with the unitary matrices U and V* having the dimensions M×M and N×N respectively. The operator* stands for the complex-conjugate, transposed matrix and $\sigma_n$ are the N singular values of G. A pseudo-inverse H of G is then established by:

$$H = V \begin{pmatrix} \sigma_1^{-1} & \ldots & 0 & 0 & \ldots & 0 \\ . & & . & . & & . \\ . & & . & . & & . \\ . & & . & . & & . \\ 0 & \ldots & \sigma_N^{-1} & 0 & \ldots & 0 \end{pmatrix} U^* \quad (8)$$

Finally, an unambiguous solution of Equation [6] is then $$\hat{C}_N = H P_M \quad (9)$$

Equation [9] can also be written as:

$$c_n = \sum_{m=1}^{M} h_{nm} \cdot p_m \quad n = 1, \ldots, N \quad (10)$$

It is clear from this equation that the reconstructed signal part $C_n$ of the $n^{th}$ VOI is obtained as linear re-combination of all measured aggregate signals $P_m$, weighted with the complex elements $h_{nm}$ of the matrix H.

Other methods can also be utilized for reconstruction of the MR signal part of the sub-regions instead of the above example. Methods based on the principle of maximum entropy. (see Skilling, editor "Maximum Entropy and Bayesian"methods, Cambridge (England), 1988, Kluwer Academic Publishers, Dordrecht (Netherlands)) theoretically utilize the information available about the shape of the VOIs to achieve better signal-to-noise ratios. Methods are also conceivable that are based on generalized series (Liang et al., "A Generalized Series Approach to MR Spectroscopic Imaging", IEEE Trans. on Med. Imaging, Vol. 10, No. 2, 1981, Pages 132–137).

By retention of the principle of phase-encoding with magnetic fields of a higher order, numerous variations and modifications of the method sequence set forth above can be envisioned with which the advantages of an excellent localization and high signal yield can likewise be achieved. In particular, it is possible to implement quantitative measurements of the local concentration of substances present in the test subject 1 with the described inventive method. It is thereby possible with this method, in a simply way, to make use of many of the parameters of the magnetic resonance examination that are otherwise difficult to bring into the calculation of the simulated model. For this purpose equation [5] recited above is expanded by the parameters which are additionally to be additionally taken into consideration. Among these, parameters in particular, are the number of accumulations for each of the sub-experiments, saturation effects due to the relaxation times of the observed spins and due to the repetition times between sub-experiments, signal attenuation due to relaxation, field strength and duration of the radio-frequency pulses that are employed in the experiment for excitation and define the rotational angle, and field strength distribution of the coils employed for transmitting the radio-frequency pulses and for receiving the MR-signals.

Due to the involvement of these and possibly all further, known parameters characterizing the test subject, the apparatus for implementation of the method, and the MR experiment in the simulated model which is utilized for the identification of the coefficients for the reconstruction, the influences of these parameters are taken directly into consideration in the calculation of the localized signal parts. This is particularly significant given employment of high-frequency coils having non-homogeneous field distribution, for example, surface coils. The locally different contributions to the measured, aggregate signal due to the location-dependency of the rotational angles produced by the radio-frequency pulses, and due to the saturation effects and the like can be taken into consideration at every individual point of the test subject 1 and thus enter directly into the reconstruction. A direct, quantitative comparison of the signal parts obtained from the various VOIs is thereby possible.

As an example of such an expansion of equation [5], which involves corresponding expansions of the equations building thereon for calculating the spatial reply function as well as the sensitivity and localization criteria, the case of employing a surface coil for sending the radio-frequency pulses as well as for receiving the MR-signal shall be discussed below. In this example their intensity distribution $B_1(x,y,z)$ is known for the components of the field orthogonal relative to the static, main magnetic field. A single pulse is employed in the MR experiment and the phase-encoding and the signal pick-up follow immediately thereupon. The constant $C_{rf}$, which describes the relationship between rotational angle a and the field distribution $B_1(x, y, z)$ is already determined by measuring the rotational angle at a known location, i.e. the dependency of the rotational angle on the location $\alpha$ $(x,y,z)$ is known. Lastly, the relaxation time $T_1$ and the repetition time of the sub-experiments $(T_R)$ are also established by selection. These parameters enter as follows into the calculation of the coefficient $g_{mn}$:

$$g_{mn} = \int_{VOI_n} \underbrace{B_1(x, y, z)}_{\text{Reception}} \cdot \underbrace{\frac{\sin(\alpha(x, y, z)) \cdot (1 - e^{-T_R/T_1})}{1 - \cos(\alpha(x, y, z)) \cdot e^{-T_R/T_1}}}_{\text{Saturation, rotational angle}} \cdot e^{-i \cdot \psi_m(x,y,z)} dxdydz$$

The first term under the integral reflects that the signal of a volume element induced in the reception coil is directly proportional to $B_1(x,y,z)$ (Hoult et a., "The Signal-To-Noise Ratio of the Nuclear Magnetic Resonance Experiment", Journal of Magnetic Resonance, 24, 71, (1976)). The second term reflects the dependencies of the transversal magnetization on the rotational angle $\alpha$ $(x,y,z)$ and on the relaxation and repetition times (Becker et al., Anal. Chem., 31, 1413, (1979)). In practice, this integral can be numerically calculated.

Calculation of the Spatial Reply Function

The spatial reply function of a phase-encoded experiment can be calculated according to equation [4], by calculating the local phase shift for each phase-encoding step at each point in the space. Subsequently, the reconstruction is implemented analogous to equation [10] for every point with the coefficients $h_{mn}$ of the matrix H. The spatial reply function $P_n(x,y,z)$ for the $n^{th}$ VOI is thus established by:

$$P_n(x, y, z) = \sum_{m=1}^{M} h_{nm} \cdot e^{-i \phi_m(x,y,z)}, m = 1, \ldots, N \tag{11}$$

This equation can be applied to every phase-encoded experiment wherein the MR-signals of the VOIs are reconstructed with a linear recombination. For that case of a conventional phase-encoded experiment with constant magnetic field gradients wherein N VOIs having the nominal size $\Delta l$ are registered and wherein an unfiltered Fourier transformation is utilized for reconstruction, the spatial reply function for the $n^{th}$ VOI at the location $\cdot \Delta l$ (see Decorps et al, "Localized Spectroscopy Using Static Magnetic Field Gradients: Comparison of Techniques", NMR Basic Principles and Progress, Vol. 27, 119-149, Springer Verlag, Berlin (1992)) is:

$$P_n(x) = \frac{\sin\left[\pi \cdot \left(n - \frac{x}{\Delta l}\right)\right]}{N \cdot \sin\left[\frac{\pi}{N} \cdot \left(n - \frac{x}{\Delta l}\right)\right]} \tag{12}$$

The spatial reply function in FIG. 2c was calculated according to this equation.

Sensitivity Criterion

The following sensitivity criterion, whose derivation is described in v. Kienlin et al. "Spectral Localization With Optimal Pointspread Function", Journal of Magnetic Resonance, 94, 268–287 (1991), is valid for the case of reconstruction methods that normalize the localized MR spectra onto the volume unit. The reconstruction method according to equations [7] through [10] corresponds to this normalization since the signals $c_n$ are defined as signals per volume unit. If a different normalization is selected, for example, the total intensity of the various VOIs is reconstructed, this must be taken into consideration in the calculation of the sensitivity criterion.

For a MR experiment with fixed parameters (defined repetition time, rotational angle of the radio-frequency pulses, echo time, etc.), the sensitivity criterion defined here, "efficiency E", indicates the percentage of the signal intensity, which is present in the VOl, that is re-encountered in the reconstructed MR signal. Expressed in other words: the signal-to-noise ratio in the reconstructed signal is degraded by (100% - E) due to the phase-encoding. Since the signal-to-noise ratio generally increases with the square root of the overall duration $T_{tot}$ of the MR experiment, this is a normalization factor in the following equation:

$$E_n = \frac{100\%}{V_n \cdot \sqrt{T_{tot}} \cdot \sqrt{\sum_{m=1}^{M} |h_{nm}|^2}} \tag{13}$$

This is the achieved efficiency $E_n$ in the detection of the MR signal of the $n^{th}$ VOl having the volume $V_n$. The terms $h_{nm}$ are the coefficients in the linear recombination of the M measured signals (see equation [10]). Except for possibly undertaking normalization with respect to the volumes, this equation is generally valid for all methods wherein a linear re-combination of the aggregated signals of all experiments is employed for reconstruction.

Localization Criterion

A conservative criterion for evaluating the quality of the localization is presented below, indicating how extensive the contamination of the MR signals of a VOl can be in the worst case. This localization criterion $L_n$ for the $n^{th}$ VOl is calculated as the integral of the absolute amount of the spatial reply function over the entire test subject outside the VOl with reference to the integral of the spatial reply function within the VOl:

$$L_n = \frac{\int_{\text{exterior } VOI_n}^{\text{Test object}} |P_n(x, y, z)| dxdydz}{\int_{\text{interior } VOI_n} P_n(x, y, z) dxdydz} \qquad (14)$$

This is a criterion that can be rather universally applied (V. Kienlin et al.), however, other, less restrictive criteria can also be found for specific applications.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for conducting a spatially resolving magnetic resonance examination of a test subject, comprising the steps of:

dividing said test subject into a plurality of regions of arbitrary shape and connectivity;

generating a fundamental, static magnetic field in a examination region in which said test subject is disposed;

conducting a plurality of discrete measurements, corresponding in number at least to the number of said regions, by exciting nuclear spins in said regions and generating magnetic fields for phase-encoding said spins, including generating at least one of said magnetic fields for phase-encoding which is locally non-linear, in at least one of said discrete measurements;

identifying phase dispersions, within each of said regions, in each phase-encoded, discrete measurement; and identifying a signal part from each region using said phase dispersions and an aggregation of signals obtained in all of said discrete measurements.

2. A method as claimed in claim 1 wherein the step of employing magnetic fields for phase-encoding is further defined by generating magnetic fields for phase-encoding by superimposition of spherical harmonic functions.

3. A method as claimed in claim 1 wherein the step of generating at least one magnetic field for phase-encoding which is locally non-linear is further defined by generating said magnetic field for phase-encoding which is locally non-linear in the approximated form of a step function along at least one spatial axis.

4. A method as claimed in claim 1 wherein the step of employing magnetic fields for phase-encoding is further defined by the steps of:

generating a prescribed set of magnetic fields in said examination region;

identifying phase dispersions of said regions of said subject arising from said set of magnetic fields;

identifying a quality criterion from said phase dispersions of said set of magnetic fields which evaluates the phase curves in said regions; and varying said set of magnetic fields until said quality criterion corresponds to a prescribed optimum.

5. A method as claimed in claim 1 comprising the additional steps of:

employing a reception coil for measuring said aggregate signal, said reception coil having a spatial field distribution associated therewith; and generating a correcting operand for the spatial field distribution of said reception coil in the identification of said phase dispersions of said regions.

6. A method as claimed in claim 1 wherein each discrete measurement has a repetition time and a spin relaxation time associated therewith, and wherein the step of identifying said phase dispersions with each of said regions is further defined by generating a correcting operand for said repetition times and said relaxation times in the identification of said phase dispersions with each of said regions.

7. A method as claimed in claim 1 wherein said nuclear spins have a rotational angle associated therewith, and wherein the step of identifying said phase dispersions with each of said regions is further defined by generating a correcting operand for said rotational angle of said spins in the identification of said phase dispersions with each of the regions.

8. An apparatus for conducting a spatially resolving magnetic resonance examination of a test subject comprising:

means, for computational purposes, for dividing said test subject into plurality of regions of arbitrary shape and connectivity;

means for generating a fundamental, static magnetic field in a examination region in which said test subject is disposed;

means for conducting a plurality of discrete measurements, corresponding in number at least to the number of said regions including means for exciting nuclear spins in said regions and means for generating magnetic fields for phase-encoding said spins, said means for generating magnetic fields including means for generating at least one of said magnetic fields for phase-encoding which is locally non-linear, in at least one of said discrete measurements;

means for identifying phase dispersions, within each of said regions, in each phase-encoded, discrete measurement; and means for identifying a signal part from each region using said phase dispersions and an aggregation of signals obtained in all of said discrete measurements.

9. An apparatus as claimed in claim 8 further comprising shim coil means for homogenizing said fundamental, static magnetic field, and wherein said means for generating at least one magnetic field for phase-encoding which is locally non-linear comprises means for employing said shim coil means for also generating said at least one magnetic field which is locally non-linear.

10. A method for conducting a spatially resolving magnetic resonance examination of a test subject, comprising the steps of:

dividing said test subject into a plurality of regions of arbitrary shape and connectivity;

generating a fundamental, static magnetic field in an examination region in which said test subject is disposed;

conducting a plurality of discrete measurements, corresponding in number at least to the number of said regions, be exciting nuclear spins in said regions and generating magnetic fields for phase-encoding said spins, including generating at least one of said magnetic fields for phase-encoding which is locally non linear, in at least one of said discrete measurements;

integrating phase dispersions separately for each of said regions within the boundaries of the respective region; and identifying a signal part arising from each region using said integrals and an aggregation of signals obtained in all of said discrete measurements.

* * * * *